(12) United States Patent
Atoji

(10) Patent No.: US 10,174,897 B2
(45) Date of Patent: Jan. 8, 2019

(54) ILLUMINATION DEVICE AND AUTOMOBILE EQUIPPED WITH SAME

(71) Applicant: Panasonic Intellectual Property Management Co., Ltd., Osaka (JP)

(72) Inventor: Makoto Atoji, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 113 days.

(21) Appl. No.: 15/513,034

(22) PCT Filed: Nov. 5, 2015

(86) PCT No.: PCT/JP2015/005550
§ 371 (c)(1),
(2) Date: Mar. 21, 2017

(87) PCT Pub. No.: WO2016/075909
PCT Pub. Date: May 19, 2016

(65) Prior Publication Data
US 2017/0307164 A1    Oct. 26, 2017

(30) Foreign Application Priority Data

Nov. 10, 2014 (JP) ................. 2014-228088

(51) Int. Cl.
*B60Q 1/04*    (2006.01)
*B60Q 11/00*    (2006.01)
(Continued)

(52) U.S. Cl.
CPC ............. *F21S 41/14* (2018.01); *B60Q 1/04* (2013.01); *B60Q 11/00* (2013.01); *B60Q 11/005* (2013.01);
(Continued)

(58) Field of Classification Search
CPC ........ B60Q 1/04; B60Q 11/00; B60Q 11/005; F21K 9/64; F21S 41/14; F21S 41/147;
(Continued)

(56) References Cited

U.S. PATENT DOCUMENTS

2011/0063115 A1* 3/2011 Kishimoto ................ F21K 9/00
340/600
2011/0084609 A1* 4/2011 Kawaguchi ......... F21V 23/0442
315/77

(Continued)

FOREIGN PATENT DOCUMENTS

DE    102012220472 A1    5/2014
DE    102012220481 A1    5/2014
(Continued)

OTHER PUBLICATIONS

International Search Report of PCT application No. PCT/JP2015/005550 dated Jan. 26, 2016.
(Continued)

*Primary Examiner* — Alexander H Taningco
*Assistant Examiner* — Renan Luque
(74) *Attorney, Agent, or Firm* — Greenblum & Bernstein, P.L.C.

(57) ABSTRACT

An illumination device includes a laser element, a fluorescent material, a light projection lens, a laser light reflector, a detection element, and a control unit connected to the detection element. The fluorescent material is disposed in a direction of propagation of laser light from the laser element, and converts the laser light into illumination light. The light projection lens and the laser light reflector are disposed in a direction of propagation of the illumination light from the fluorescent material. The detection element can detect the laser light reflected on the laser light reflector and external light. The control unit calculates a comparison value by
(Continued)

comparing the amount detected by the detection element when the laser element is emitting the laser light and the amount detected by the detection element when the laser element is not emitting the laser light.

14 Claims, 9 Drawing Sheets

(51) Int. Cl.
*F21S 43/00* (2018.01)
*F21V 23/00* (2015.01)
*F21S 41/14* (2018.01)
*F21S 41/16* (2018.01)
*F21S 41/20* (2018.01)
*F21S 41/25* (2018.01)
*F21S 41/39* (2018.01)
*F21V 25/04* (2006.01)
*H01S 5/022* (2006.01)
*F21S 41/255* (2018.01)

(52) U.S. Cl.
CPC .............. *F21S 41/16* (2018.01); *F21S 41/25* (2018.01); *F21S 41/285* (2018.01); *F21S 41/39* (2018.01); *F21S 43/00* (2018.01); *F21V 23/00* (2013.01); *F21V 25/04* (2013.01); *H01S 5/022* (2013.01); *F21S 41/255* (2018.01)

(58) Field of Classification Search
CPC .......... F21S 41/16; F21S 41/25; F21S 41/255; F21S 41/285; F21S 41/32; F21S 41/37; F21S 41/39; F21S 41/675; F21S 43/00; F21S 45/00; F21S 48/1145; F21S 48/1159; F21S 48/1225; F21V 23/00; F21V 23/0457; F21V 25/00; F21V 25/02; F21V 25/04; F21Y 2115/30; G01J 1/42; G01J 2001/4247; G01J 3/505; G01M 11/0285; G02B 26/10; G02B 5/02; G02B 5/32; G03B 21/204; G03B 21/2066; G03B 21/208; H01S 3/0078; H01S 5/005; H01S 5/022; H01S 5/02296; H01S 5/06808; H01S 5/06825; H01S 5/0683

See application file for complete search history.

(56) References Cited

U.S. PATENT DOCUMENTS

| | | | | |
|---|---|---|---|---|
| 2011/0116520 | A1* | 5/2011 | Krijn | H01S 5/005 372/29.02 |
| 2012/0050691 | A1* | 3/2012 | Tsuda | G03B 21/204 353/31 |
| 2012/0140501 | A1* | 6/2012 | Nakazato | F21S 41/16 362/510 |
| 2014/0168940 | A1* | 6/2014 | Shiomi | B60Q 1/0023 362/84 |
| 2014/0375968 | A1* | 12/2014 | Tsuda | G03B 21/204 353/85 |
| 2016/0003707 | A1* | 1/2016 | Ahn | G01J 3/505 356/402 |
| 2016/0033112 | A1* | 2/2016 | Weissenberger | F21V 25/02 362/510 |
| 2016/0069819 | A1* | 3/2016 | Ichikawa | G01N 21/95 361/86 |
| 2016/0153632 | A1* | 6/2016 | Mitterlehner | F21S 48/1145 250/214 R |
| 2017/0102118 | A1* | 4/2017 | Nauen | F21S 41/125 |
| 2017/0240094 | A1* | 8/2017 | Kunecke | F21V 25/02 |

FOREIGN PATENT DOCUMENTS

EP 2297827 B1 6/2012
JP 2011-086432 4/2011

OTHER PUBLICATIONS

The Extended European Search Report dated Oct. 16, 2017 for the related European Patent Application No. 15859138.8.

* cited by examiner

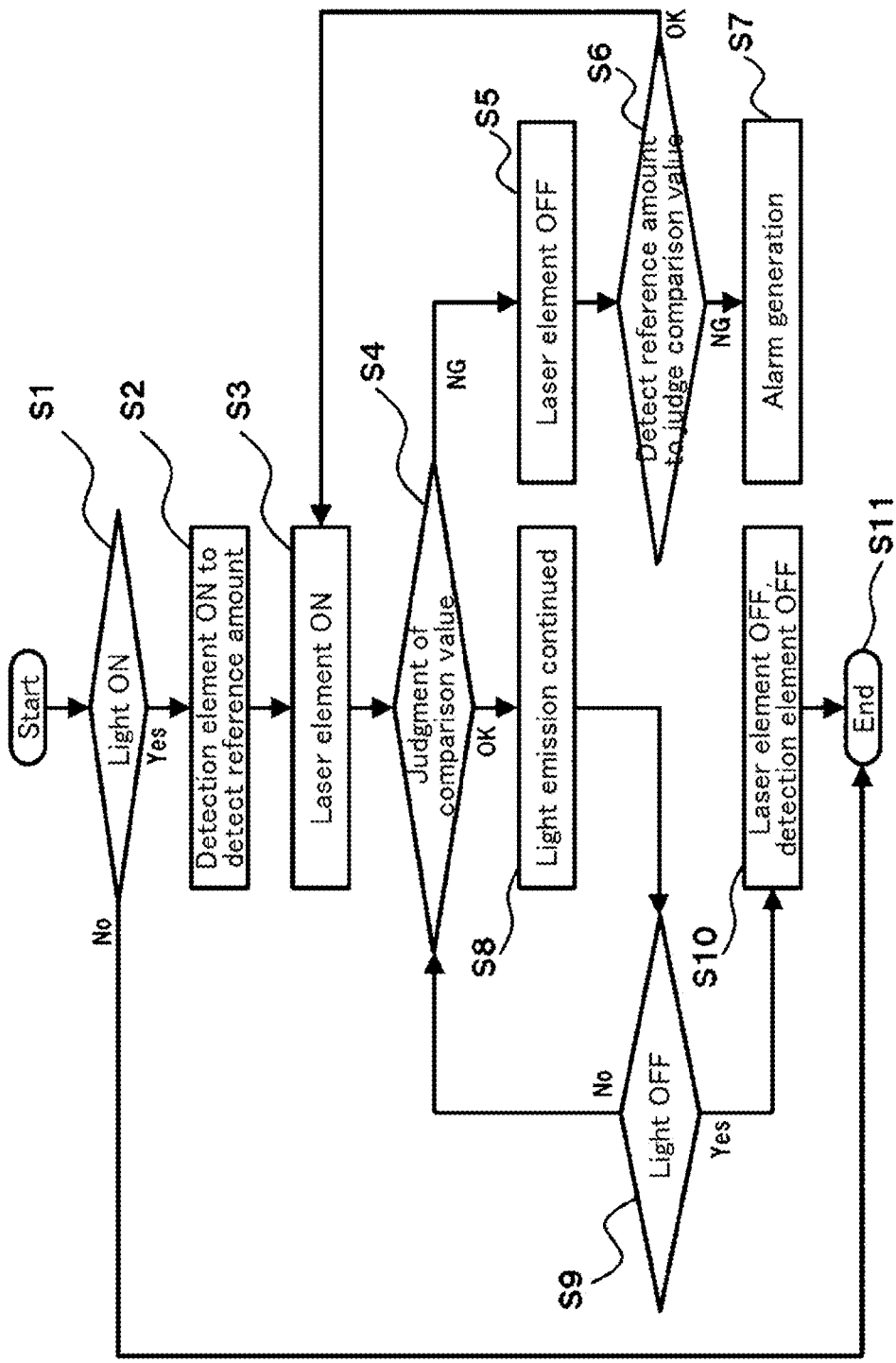

ILLUMINATION DEVICE AND AUTOMOBILE EQUIPPED WITH SAME

This application is a U.S. national stage application of the PCT International Application No. PCT/JP2015/005550 filed on Nov. 5, 2015, which claims the benefit of foreign priority of Japanese patent application 2014-228088 filed on Nov. 10, 2014, the contents all of which are incorporated herein by reference.

TECHNICAL FIELD

The present invention relates to an illumination device used as a headlight of automobile, and an automobile equipped with illumination device.

BACKGROUND ART

An illumination device employing a laser element that mainly emits laser light of a predetermined frequency has been developed. The illumination device includes this laser element, a fluorescent material, a light projection lens, a detection element, and a control unit. The fluorescent material is disposed in a direction of propagation of the laser light from the laser element, and converts the laser light into illumination light. The light projection lens is disposed in a direction of propagation of the illumination light from this fluorescent material. The detection element can detect laser light reflected on the fluorescent material. The control unit is connected to this detection element. PTL1 is known as a prior art similar to this illumination device.

CITATION LIST

Patent Literature

PTL1; Japanese Patent Unexamined Publication No. 2011-86432

SUMMARY OF INVENTION

The present invention offers a highly-reliable illumination device with respect to safety.

An illumination device according to a first aspect of the present invention includes a laser element, a fluorescent material, a light projection lens, a laser light reflector, a detection element, and a control unit connected to the detection element. The fluorescent material is disposed in a direction of propagation of laser light from the fluorescent material, and converts the laser light into illumination light. The light projection lens and the laser light reflector are disposed in a direction of propagation of the illumination light from the fluorescent material. The detection element can detect the laser light reflected on the laser light reflector and external light. The control unit calculates a comparison value by comparing the amount detected by the detection element when the laser element is emitting the laser light and the amount detected by the detection element when the laser element is not emitting the laser light. When the comparison value becomes larger than a first threshold, the laser light from the laser element is stopped or attenuated.

An illumination device according to a second aspect of the present invention includes a laser element, a fluorescent material, a light projection lens, a detection element, and a control unit connected to the detection element. The fluorescent material is disposed in a direction of propagation of laser light from the laser element, and converts the laser light into illumination light. The light projection lens is disposed in a direction of propagation of the illumination light from the fluorescent material. The detection element can detect the laser light reflected on a surface of the fluorescent material facing the laser element and external light. The control unit calculates a comparison value by comparing the amount detected by the detection element when the laser element is emitting the laser light and the amount detected by the detection element when the laser element is not emitting the laser light. When the comparison value becomes larger than the first threshold, the laser light from the laser element is stopped or attenuated.

An illumination device according to a third aspect of the present invention includes a laser element, a fluorescent material, a light projection lens, a detection element, and a control unit connected to the detection element. The fluorescent material is disposed in a direction of propagation of laser light from the laser element, and converts the laser light into illumination light. The light projection lens is disposed in a direction of propagation of the illumination light from the fluorescent material. The detection element can detect the laser light reflected on a surface of the light projection lens facing the fluorescent material and external light. The control unit calculates a comparison value by comparing the amount detected by the detection element when the laser element is emitting the laser light and the amount detected by the detection element when the laser element is not emitting the laser light. When the comparison value becomes larger than the first threshold, the laser light from the laser element is stopped or attenuated.

In any of the above configurations, the laser light is not emitted to an illumination area via the light projection lens when the fluorescent material is damaged. Accordingly, safety is improved. Still more, when the comparison value is larger than the first threshold, the laser light from the laser element is stopped or attenuated, and thus there is less influence of external light. This also increases reliability with respect to safety.

BRIEF DESCRIPTION OF DRAWINGS

FIG. 7 is a flow chart of the operation of the illumination device in FIG. 2 and FIG. 3.

DESCRIPTION OF EMBODIMENTS

Figure 1:
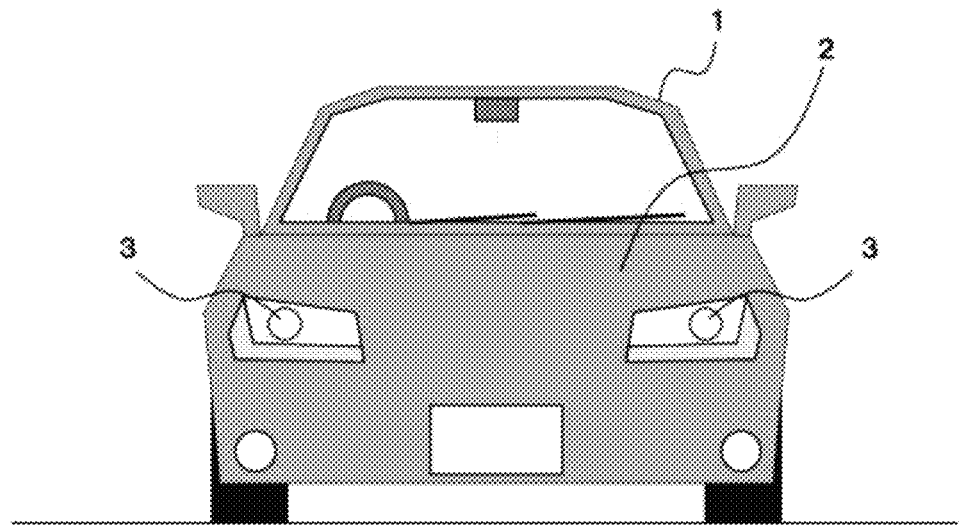
FIG. 1 is a front view of an automobile equipped with an illumination device in accordance with a first exemplary embodiment of the present invention.

Before describing exemplary embodiments of the present invention, disadvantages of a conventional illumination device are briefly described. In the aforementioned conventional illumination device, illuminating performance and safety are increased by converting laser light emitted from a laser element into illumination light by a fluorescent material.

More specifically, laser light emitted from the laser element is coherent light of a predetermined frequency. If this light reaches eyes directly, the power density extremely increases, resulting in a safety problem. Accordingly, the fluorescent material converts the laser light into illumination light.

When the fluorescent material is damaged, unconverted laser light is emitted as it is. A control unit thus detects damage to the fluorescent material by a detection element, and stops or attenuates laser light from the laser element.

More specifically, a part of laser light emitted from the laser element toward the fluorescent material is reflected on a surface of this fluorescent material facing the laser element, and this reflected light is detected by the detection element.

The presence of reflected light toward the detection element signifies that the fluorescent material is not damaged, and therefore the control unit continues to emit laser light from the laser element. On the other hand, no reflected light toward the detection element signifies that the fluorescent material is damaged, and therefore, the control unit stops or attenuates laser light emitted from the laser element.

However, when this illumination device is installed in an automobile, for example, brightness changes, depending on the surrounding environment of the automobile. If external light reaches inside the illumination device in this state, malfunction may occur.

More specifically, external light also includes a predetermined frequency component same as the laser light. If this external light reaches the detection element via a light projection lens, the detection element detects the predetermined frequency component (a part of external light) same as that of the laser light, although the fluorescent material is damaged. In this case, damage to the fluorescent material may not be detected, degrading reliability. Still more, the detection element has detection sensitivity over a broad frequency range from ultraviolet light to near infrared light. For example, a silicon photodiode has detection sensitivity to wavelengths from 300 nm to 1100 nm. Therefore, when external light includes frequency components equivalent to a range from ultraviolet light to near infrared light and reaches the detection element via the light projection lens, the control unit erroneously detects the external light as the laser light, although the fluorescent material is damaged. In this case, the control unit cannot find damage to the fluorescent material.

Described below are examples of illumination devices installed in an automobile in accordance with exemplary embodiments of the present invention, with reference to drawings.

First Exemplary Embodiment

Figure 2:
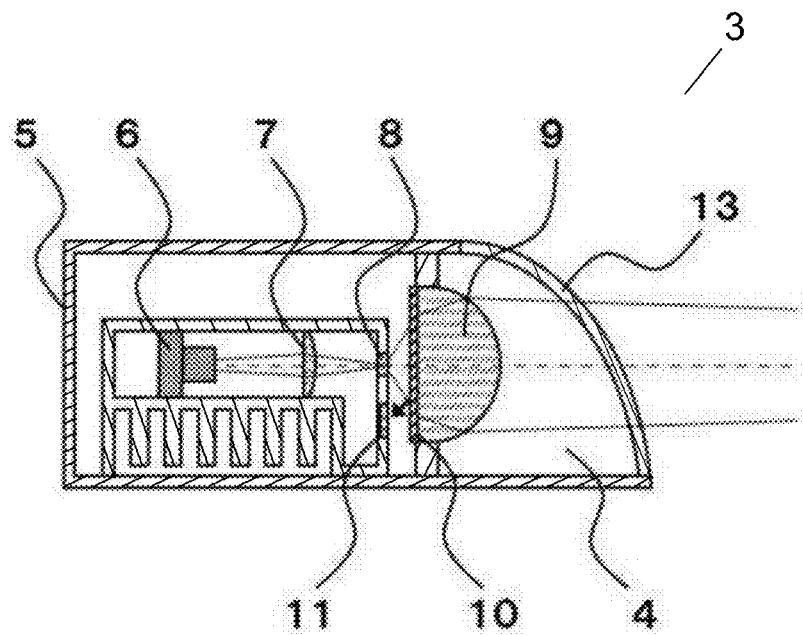
FIG. 2 is a sectional view of the illumination device in accordance with the first exemplary embodiment of the present invention.
Figure 3:
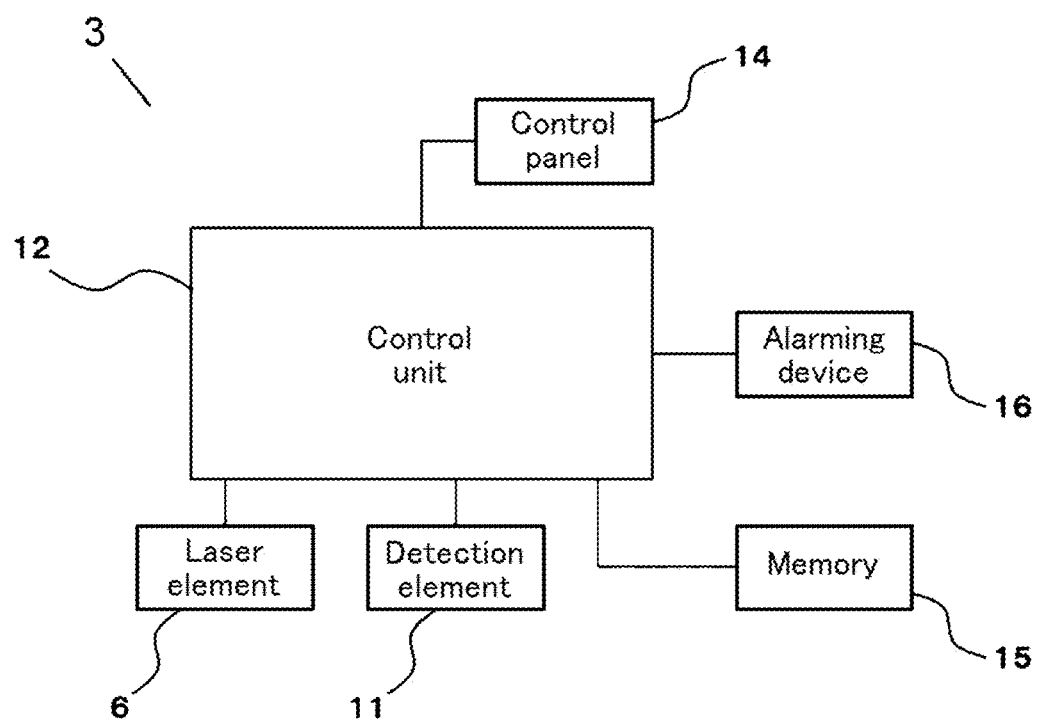
FIG. 3 is a control block diagram of the illumination device in accordance with the first exemplary embodiment of the present invention.

FIG. 1 is a front view of automobile 1 in which illumination device 3 in accordance with the first exemplary embodiment of the present invention is installed. FIG. 2 is a sectional view of illumination device 3, and FIG. 3 is a control block diagram of illumination device 3.

In FIG. 1, a so-called headlight, which is illumination device 3, is disposed at both sides of the front of main body 2 of automobile 1.

As shown in FIG. 2, illumination device 3 includes main case 5, laser element 6, condenser lens 7, fluorescent material 8, light projection lens 9, laser light reflector 10, detection element 11, and outer lens 13. As shown in FIG. 3, illumination device 3 further includes control unit 12 connected to detection element 11.

Main case 5 includes opening 4 at the front side. Laser element 6 is disposed inside main case 5, and autonomously emits laser light of a predetermined frequency (e.g., a wavelength of 405 nm). Condenser lens 7 is disposed in a direction of propagation of the laser light from laser element 6, and condenses the laser light. Fluorescent material 8 converts this condensed laser light into illumination light (red, green, and blue; hereinafter referred to as R, G, and B). Light projection lens 9 is disposed in a direction of propagation of the illumination light from fluorescent material 8. Detection element 11 can detect the laser light reflected on laser light reflector 10 and external light reaching detection element 11 via light projection lens 9. Outer lens 13 is mounted on opening 4 of main case 5.

In FIG. 2, laser light reflector 10 is disposed between fluorescent material 8 and light projection lens 9. More specifically, laser light reflector 10 is formed on a surface of light projection lens 9 facing fluorescent material 8, typically by sputtering, deposition, or application. Laser light reflector 10 reflects light of the above predetermined frequency (e.g., a wavelength of 405 nm or less) roughly 100%.

As shown in FIG. 3, control panel 14 for the user to turn on and off the light from inside automobile 1, memory 15 typically for storing operation programs, and alarming device 16 are connected to control unit 12, in addition to laser element 6 and detection element 11.

Figure 4A:
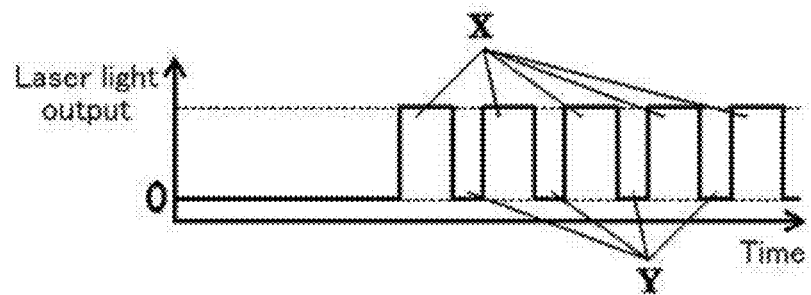
FIG. 4A shows output from a laser element in the illumination device shown in FIG. 2.
Figure 4B:
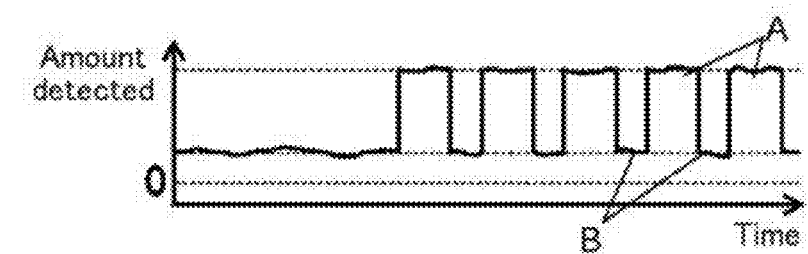
FIG. 4B shows an amount detected by a detection element in the illumination device shown in FIG. 2.
Figure 4C:
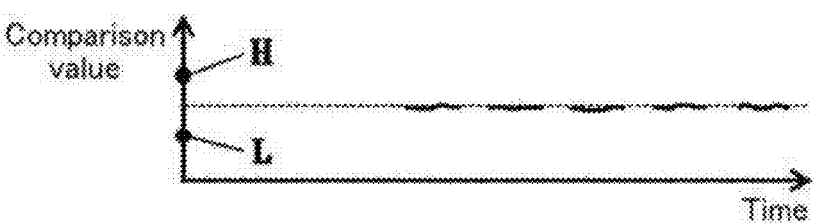
FIG. 4C shows a comparison value between the output from the laser element in FIG. 4A and the amount detected by the detection element in FIG. 4B.

In the above configuration, control unit 12 controls output of laser light by laser element 6, and calculates a comparison value between the output of laser light and the amount detected by detection element 11. FIG. 4A shows the output of laser light from laser element 6. FIG. 4B shows the amount detected by detection element 11. FIG. 4C shows a comparison value between the output from the laser element in FIG. 4A and the amount detected by the detection element in FIG. 4B.

Figure 5A:
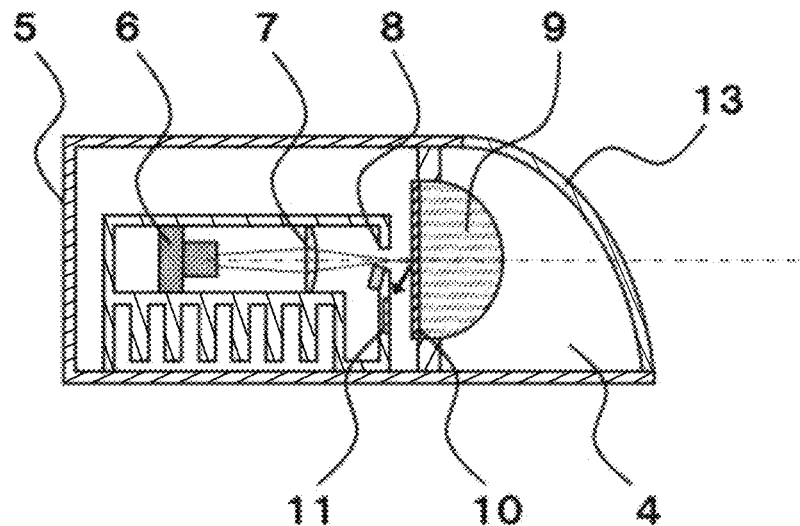
FIG. 5A is a sectional view of the illumination device in FIG. 2 in a state that the fluorescent material is damaged.
Figure 5B:
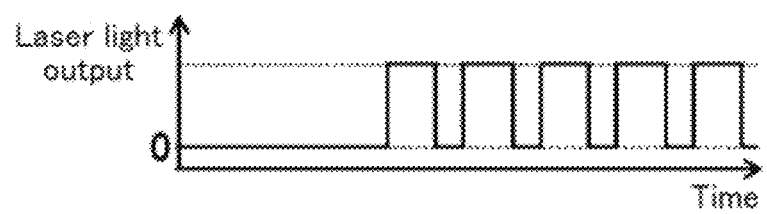
FIG. 5B shows output from the laser element in the illumination device in FIG. 5A.
Figure 5C:
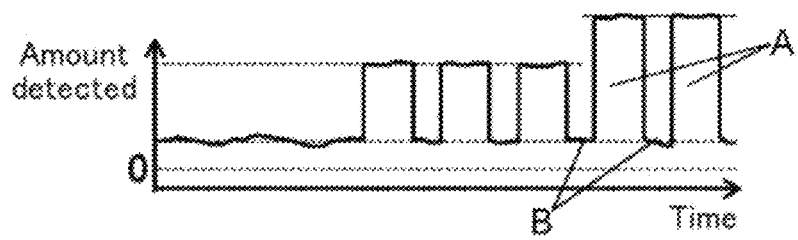
FIG. 5C shows an amount detected by the detection element in the illumination device in FIG. 5A.
Figure 5D:
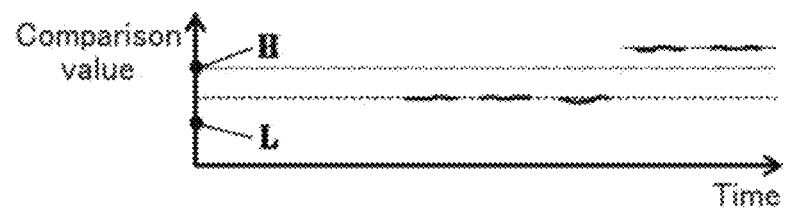
FIG. 5D shows a comparison value between the output from the laser element in FIG. 5B and the amount detected by the detection element in FIG. 5C.

Next is described an effect of this configuration with reference to FIG. 5A to FIG. 5D. FIG. 5A is a sectional view of illumination device 3 in a state fluorescent material 8 is damaged. FIG. 5B to FIG. 5D are charts equivalent to FIG. 4A to FIG. 4C in the state shown in FIG. 5A. As shown in FIG. 4A and FIG. 5B, laser light is intermittently output.

A characteristic of illumination device 3 in the exemplary embodiment is that laser light reflector 10 is disposed in a direction of propagation of the illumination light from fluorescent material 8. In other words, laser light reflector 10 is disposed on a surface of light projection lens 9 facing fluorescent material 8.

In this configuration, the laser light is reflected roughly 100% on light projection lens 9 toward a direction of fluorescent material 8, even if fluorescent material 8 is damaged and laser light of predetermined frequency is propagated from laser element 6 to light projection lens 9, as shown in FIG. 5A. As a result, no laser light of predetermined frequency from laser element 6 is emitted to an illumination area via light projection lens 9. Safety is thus improved.

Still more, in the exemplary embodiment, as shown in FIG. 4A to FIG. 4C, control unit 12 compares amount (A) detected by detection element 11 when laser element 6 is emitting the laser light (X in FIG. 4A) and amount (B) detected by detection element 11 when laser element 6 is not emitting laser light (Y in FIG. 4A). Control unit 12 stops or attenuates laser light from laser element 6 when this comparison value (A−B) becomes larger than first threshold (H).

More specifically, when fluorescent material 8 is damaged, as shown in FIG. 5A, and laser light of predetermined frequency from laser element 6 is propagated to light projection lens 9, the laser light is reflected on laser light reflector 10, and amount (A) detected by detection element 11 increases, as shown on the right side of FIG. 5C.

Then, control unit 12 detects damage to fluorescent material 8 based on amount (A) detected and amount (B) detected, and stops or attenuates laser light from laser element 6. Accordingly, no laser light of predetermined frequency from laser element 6 is emitted to an illumination area via light projection lens 9. Safety is thus improved.

FIG. 4B and FIG. 5C show amount (A) detected by detection element 11. FIG. 4C and FIG. 5D show a comparison value between amount (A) detected by detection element 11 when laser element 6 is emitting the laser light (X in FIG. 4A) and amount (B) detected by detection element 11 when laser element 6 is not emitting laser light (Y in FIG. 4A). If this comparison value (A−B) is larger than, for example, the first threshold (H in FIG. 4C and FIG. 5D), control unit 12 detects damage to fluorescent material 8, and stops or attenuates laser light from laser element 6.

Accordingly, no laser light of predetermined frequency from laser element 6 is practically emitted to an illumination area via light projection lens 9. Safety is thus improved.

Figure 6A:
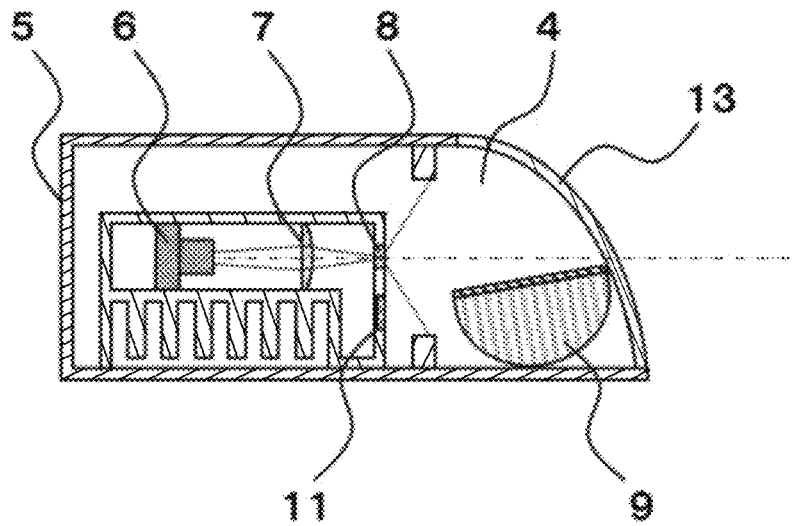
FIG. 6A is a sectional view of the illumination device in FIG. 2 in a state that the light projection lens is damaged.
Figure 6B:
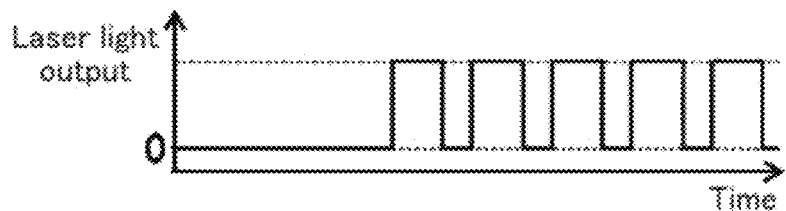
FIG. 6B shows output from the laser element in the illumination device in FIG. 6A.
Figure 6C:
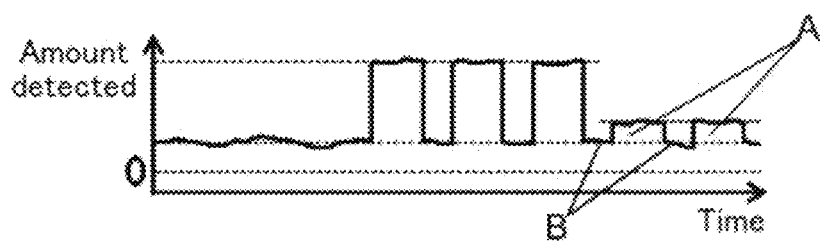
FIG. 6C shows an amount detected by the detection element in the illumination device in FIG. 6A.
Figure 6D:
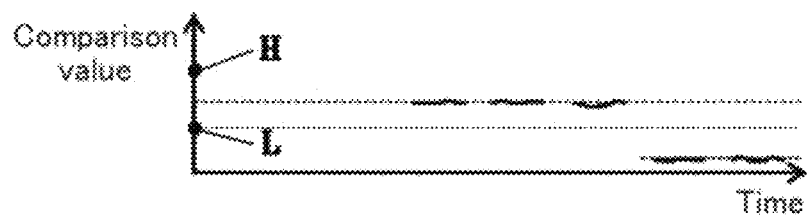
FIG. 6D shows a comparison value between the output from the laser element in FIG. 6B and the amount detected by the detection element in FIG. 6C.

FIG. 6A is a sectional view in a state light projection lens 9 is damaged (including a state it is out of an ordinary position). FIG. 6B to FIG. 6D are charts equivalent to FIG. 4A to FIG. 4C in the state shown in FIG. 6A. As shown in FIG. 6B, laser light is intermittently output.

In this state, no laser light reflector 10 is present on a surface of light projection lens 9 facing laser element 6. Accordingly, amount (A) detected by detection element 11 becomes small, as shown on the right side of FIG. 6C.

Here, even if the laser light of predetermined frequency from laser element 6 is propagated to light projection lens 9, laser light is converted into illumination light (R, G, and B) because fluorescent material 8 is present. Accordingly, safety is secured.

However, if fluorescent material 8 is also damaged later, a dangerous state is anticipated because laser element 6 is emitting the laser light of predetermined frequency to an illumination area via outer lens 13.

Therefore, the exemplary embodiment compares amount (A) detected by detection element 11 when laser element 6 is emitting the laser light (X in FIG. 4A) and amount (B) detected by detection element 11 when laser element 6 is not emitting laser light (Y in FIG. 4A). When this comparison value (A−B) is smaller than, for example, the second threshold (L in FIG. 4C and FIG. 6D), control unit 12 detects damage to fluorescent material 8, and stops or attenuates laser light from laser element 6. Second threshold (L) is set smaller than first threshold (H). In other words, second threshold (L) is different from first threshold (H).

As a result, no laser light of predetermined frequency from laser element 6 is emitted to an illumination area via light projection lens 9. Safety is thus improved.

FIG. 6C shows amount (A) detected by detection element 11, and FIG. 6D shows a comparison value between amount (A) detected by detection element 11 when laser element 6 is emitting the laser light (X in FIG. 4A) and amount (B) detected by detection element 11 when laser element 6 is not emitting laser light (Y in FIG. 4A). When this comparison value (A−B) is smaller than, for example, the second threshold (L in FIG. 4C and FIG. 6D), control unit 12 detects damage, and stops or attenuates laser light from laser element 6.

Accordingly, no laser light of predetermined frequency from laser element 6 is practically emitted to an illumination area via outer lens 13. Safety is thus improved.

Aforementioned control centering on control unit 12 is described with reference to FIG. 7. FIG. 7 is an operation flow chart of illumination device 3.

First, when the user turns on the light, using control panel 14 (51 in FIG. 7), control unit 12 sets detection element 11 to a detectable state to detect the amount at this point. In other words, control unit 12 detects the state of external light from illumination device 3 as a reference amount (S2 in FIG. 7).

More specifically, depending on the external environment (time, climate, etc.) of automobile 1, light of a frequency same as that of a predetermined frequency from laser element 13 enters detection element 11 via outer lens 13 and light projection lens 9 in the external light entering illumination device 3. The amount detected at this point becomes a reference amount.

Then, control unit 12 drives laser element 6, and light of the predetermined frequency is emitted from laser element 6 (S3 in FIG. 4A and FIG. 7).

Then, laser light of predetermined frequency from laser element 6 is emitted to condenser lens 7 and fluorescent material 8, and fluorescent material 8 converts the laser light into illumination light (R, G, and B). This converted light illuminates an illumination area via light projection lens 9 and outer lens 13.

In this state, control unit 12 compares amount (A) detected by detection element 11 when laser element 6 is emitting the laser light (X in FIG. 4A) and amount (B) detected by detection element 11 when laser element 6 is not emitting laser light (Y in FIG. 4A). If this comparison value (A–B) is larger than first threshold (H) (NG at S4 in FIG. 7), the laser light from laser element 6 is stopped or attenuated (S5 in FIG. 7).

In other words, if fluorescent material 8 is damaged, as shown in FIG. 5A, and the laser light of the predetermined frequency from laser element 6 is propagated to light projection lens 9, the laser light is reflected on laser light reflector 10, and amount (A) detected by detection element 11 increases, as shown on the right side of FIG. 5C.

Accordingly, control unit 12 detects damage to fluorescent material 8, and stops or attenuates laser light from laser element 6. No laser light of predetermined frequency from laser element 6 is thus emitted to an illumination area via light projection lens 9. Safety is thus improved.

Still more, control unit 12 compares amount (A) detected by detection element 11 when laser element 6 is emitting the laser light (X in FIG. 4A) and amount (B) detected by detection element 11 when laser element 6 is not emitting laser light (Y in FIG. 4A). If this comparison value (A–B) is smaller than the second threshold (L in FIG. 4C and FIG. 6D) (NG at S4 in FIG. 7), control unit 12 detects damage to light projection lens 9, and stops or attenuates laser light from laser element 6 (S5 in FIG. 7).

As a result, no laser light of predetermined frequency from laser element 6 is emitted to an illumination area via light projection lens 9. Safety is thus improved.

Then, control unit 12 obtains a reference amount again. Control unit 12 compares amount (A) detected by detection element 11 when laser element 6 is emitting the laser light (X in FIG. 4A) and amount (B) detected by detection element 11 when laser element 6 is not emitting laser light (Y in FIG. 4A). If this comparison value (A–B) is larger than the first threshold (H in FIG. 4C and FIG. 5D) (NG at S6 in FIG. 7), control unit 12 detects damage to fluorescent material 8, and retains the stopped or attenuated state of the laser light from laser element 6 (S6 in FIG. 7).

If comparison value (A–B) is smaller than the second threshold (L in FIG. 4C and FIG. 6D), control unit 12 detects damage, and retains the stopped or attenuated state of the laser light from laser element 6 (S6 in FIG. 7).

In this state, control unit 12 generates alarm from alarming device 16 (S7 in FIG. 7).

Furthermore, at S4 in FIG. 7, if comparison value (A–B) is not greater than the first threshold (H in FIG. 4C and FIG. 5D) and not less than the second threshold (L in FIG. 4C and FIG. 6D) (OK at S4), control unit 12 continues laser light from laser element 6 to retain light emission (S8 in FIG. 7).

Then, when the light is turned off via control panel 14 (S9 in FIG. 7), laser element 6 is turned off (S10 and S11 in FIG. 7).

Figure 8A:
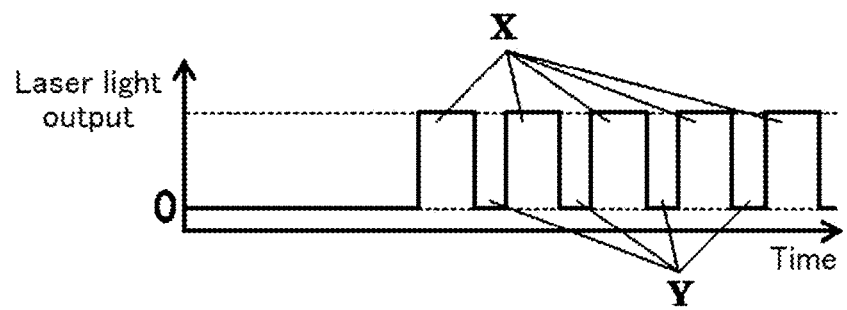
FIG. 8A shows output from the laser element in the illumination device in FIG. 2.
Figure 8B:
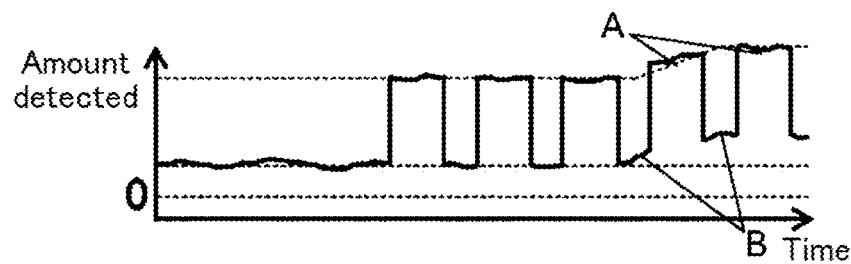
FIG. 8B shows an amount detected by the detection element in the illumination device in FIG. 2.
Figure 8C:
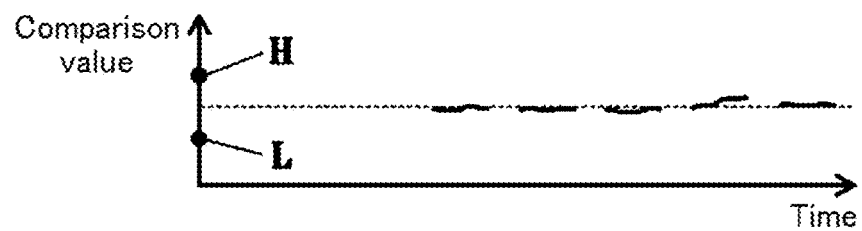
FIG. 8C shows a comparison value between the output from the laser element in FIG. 8A and the amount detected by the detection element in FIG. 8B.

Next is described about propagation of external light via outer lens 13 and light projection lens 9, with reference to FIG. 8A to FIG. 8C. FIG. 8A to FIG. 8C are charts equivalent to FIG. 4A to FIG. 4C, respectively, in a state external light is propagated inside illumination device 3. As shown in FIG. 8A, laser light is intermittently output. In this case, the light of the same frequency as the predetermined frequency from laser element 6 in the external light reaches detection element 11.

Then, amount (B) detected by detection element 11 when laser element 6 is not emitting laser light at S4 in FIG. 7 (Y in FIG. 4A) increases, as shown on the right side of FIG. 8B.

Here, since amount (A) detected by detection element 11 when laser element 6 is emitting the laser light (X in FIG. 4A) also increases, comparison value (A–B) is not affected by the external light. Accordingly, control unit 12 can execute appropriate control.

More specifically, also in this case, control unit 12 compares amount (A) detected by detection element 11 when laser element 6 is emitting the laser light (X in FIG. 4A) and amount (B) detected by detection element 11 when laser element 6 is not emitting laser light (Y in FIG. 4A) at S4 in FIG. 7. If this comparison value (A–B) is not greater than the first threshold (H in FIG. 4C) and not less than the second threshold (L in FIG. 4C and FIG. 6D), control unit 12 continues emission of the laser light from laser element 6 (S8 in FIG. 7). In this way, control unit 12 can execute appropriate control without being affected by external light.

FIG. 8B shows amount (A) detected by detection element 11, and FIG. 8C shows a comparison value between amount (A) detected by detection element 11 when laser element 6 is emitting the laser light (X in FIG. 4A) and amount (B) detected by detection element 11 when laser element 6 is not emitting laser light (Y in FIG. 4A). If this comparison value (A–B) is smaller than, for example, the second threshold (L in FIG. 8C and FIG. 6D), control unit 12 detects damage to light projection lens 9, and stops or attenuates laser light from laser element 6.

Accordingly, no laser light of the predetermined frequency from laser element 6 is practically emitted to an illumination area via outer lens 13. Safety is thus improved.

In the above description, A–B is adopted as the comparison value. However, the comparison value is not limited to it. For example, B–A, A/B, and B/A are applicable to the comparison value. The first and second thresholds may be set according to the comparison value applied.

Second Exemplary Embodiment

Figure 9:
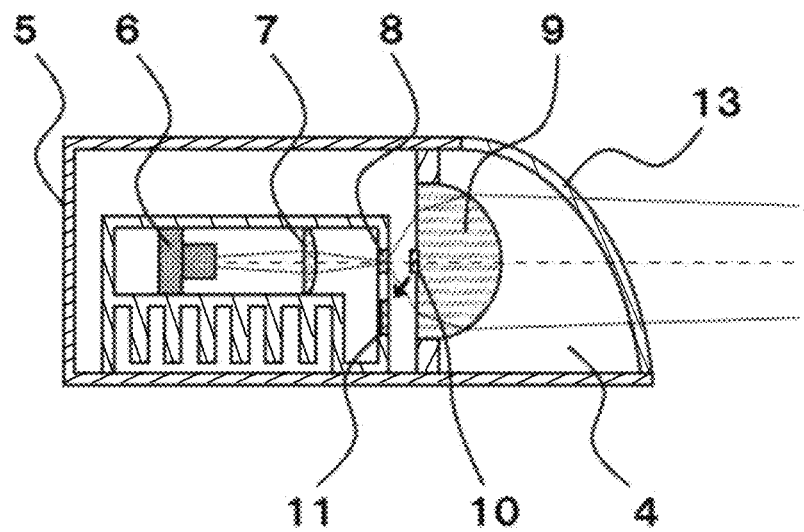
FIG. 9 is a sectional view of an illumination device in accordance with a second exemplary embodiment of the present invention.

FIG. 9 is a sectional view of an illumination device in accordance with the second exemplary embodiment of the present invention. In the first exemplary embodiment, laser light reflector 10 is provided on the entire surface of light projection lens 9 facing fluorescent material 8. On the other hand, in this exemplary embodiment, laser light reflector 10 is provided on a surface of light projection lens 9 facing fluorescent material 8 only on a portion facing fluorescent material 8.

Other components are the same as that of the first exemplary embodiment shown in FIG. 1 to FIG. 8C. This configuration also achieves the effect same as that of the first exemplary embodiment.

Third Exemplary Embodiment

Figure 10:
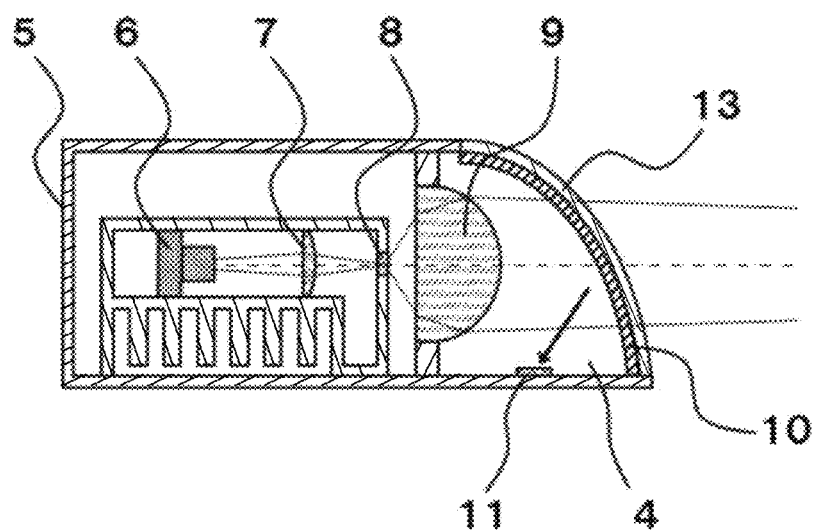
FIG. 10 is a sectional view of an illumination device in accordance with a third exemplary embodiment of the present invention.

FIG. 10 is a sectional view of an illumination device in accordance with the third exemplary embodiment. In the exemplary embodiment, laser light reflector 10 is disposed on the illumination light emitting side of light projection lens 9. In other words, laser light reflector 10 is disposed in a direction of propagation of the illumination light from light projection lens 9.

More specifically, outer lens 13 is disposed in a direction of propagation of the illumination light from light projection lens 9, and laser light reflector 10 is provided on a surface of outer lens 13 facing light projection lens 9. Detection element 11 is also provided between outer lens 13 and light projection lens 9.

The basic operation and other components are the same as that of the first exemplary embodiment shown in FIG. 1 to FIG. 8C. This configuration also achieves the effect same as that of the first exemplary embodiment.

Fourth Exemplary Embodiment

Figure 11:
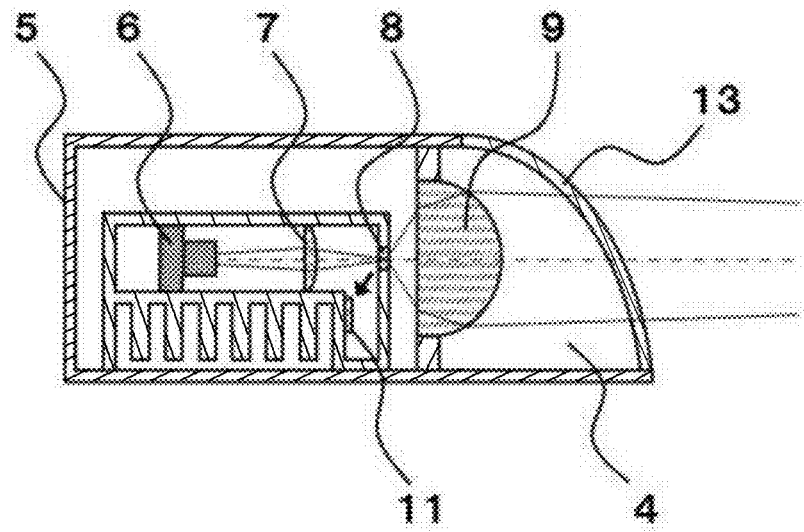
FIG. 11 is a sectional view of an illumination device in accordance with a fourth exemplary embodiment of the present invention.

FIG. 11 is a sectional view of an illumination device in the fourth exemplary embodiment of the present invention. The illumination device in this exemplary embodiment excludes laser light reflector 10 from illumination device 3 in the first exemplary embodiment, and detection element 11 is provided at a position that can detect laser light reflected on a surface of fluorescent material 8 facing laser element 6 and external light reaching detection element 11 via outer lens 13 and light projection lens 9. Other components are the same as that of illumination device 3.

More specifically, this illumination device includes laser element 6, fluorescent material 8, light projection lens 9, detection element 11, outer lens 13, and control unit 12 shown in FIG. 3. Laser element 6 emits laser light of 450 nm as a predetermined frequency. Fluorescent material 8 is disposed in a direction of propagation of the laser light from laser element 6, and converts the laser light into illumination light. Light projection lens 9 is disposed in a direction of propagation of the illumination light from fluorescent material 8. Detection element 11 can detect the laser light reflected on a surface of fluorescent material 8 facing laser element 6 and external light reaching detection element 11 via outer lens 13 and light projection lens 9. Control unit 12 is connected to detection element 11.

Same as in the first exemplary embodiment, control unit 12 compares amount (A) detected by detection element 11 when laser element 6 is emitting the laser light and amount (B) detected by detection element 11 when laser element 6 is not emitting laser light. When this comparison value (A–B) is larger than first threshold (H), control unit 12 stops or attenuates laser light from laser element 6. When comparison value (A–B) is smaller than second threshold (L), control unit 12 also stops or attenuates laser light from laser element 6.

The basic operation and other components are the same as that of the first exemplary embodiment shown in FIG. 1 to FIG. 8C. This configuration also achieves the effect same as that of the first exemplary embodiment.

Fifth Exemplary Embodiment

Figure 12:
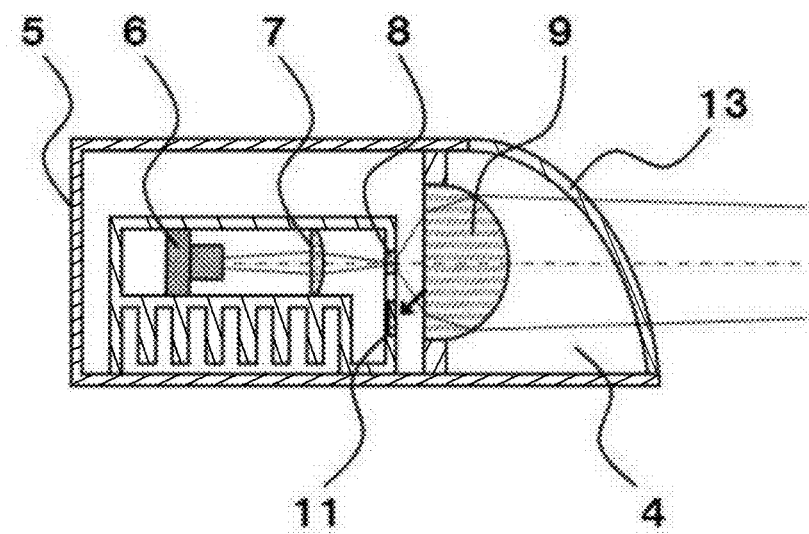
FIG. 12 is a sectional view of an illumination device in accordance with a fifth exemplary embodiment of the present invention.

FIG. 12 is a sectional view of an illumination device in accordance with the fifth exemplary embodiment of the present invention. The illumination device in the exemplary embodiment excludes laser light reflector 10 from illumination device 3 in the first exemplary embodiment, and detection element 11 is disposed at a position that can detect laser light reflected on a surface of light projection lens 9 facing fluorescent material 8 and external light reaching detection element 11 via light projection lens 9. Other components are the same as that of illumination device 3.

More specifically, this illumination device includes laser element 6, fluorescent material 8, light projection lens 9, detection element 11, outer lens 13, and control unit 12 shown in FIG. 3. Laser element 6 emits laser light of 450 nm as a predetermined frequency. Fluorescent material 8 is disposed in a direction of propagation of the laser light from laser element 6, and converts the laser light into illumination light. Light projection lens 9 is disposed in a direction of propagation of the illumination light from fluorescent material 8. Detection element 11 can detect laser light reflected on a surface of light projection lens 9 facing fluorescent material 8 and external light reaching detection element 11 via light projection lens 9. Control unit 12 is connected to detection element 11.

Same as in the first exemplary embodiment, control unit 12 compares amount (A) detected by detection element 11 when laser element 6 is emitting the laser light and amount (B) detected by detection element 11 when laser element 6 is not emitting laser light. When this comparison value (A–B) is larger than first threshold (H), control unit 12 stops or attenuates laser light from laser element 6. When comparison (A–B) is smaller than second threshold (L), control unit 12 also stops or attenuates laser light from laser element 6.

The basic operation and other components are the same as that of the first exemplary embodiment shown in FIG. 1 to FIG. 8C. This configuration also achieves the effect same as that of the first exemplary embodiment.

In the description of the first to fifth exemplary embodiments, laser element 6 autonomously emits laser light of a predetermined frequency, and external light reaches detection element 11 via light projection lens 9. However, each exemplary embodiment is not limited to this description.

INDUSTRIAL APPLICABILITY

As described above, the laser light reflector is disposed in a direction of propagation of illumination light from the fluorescent material in the illumination device of the present invention. Accordingly, no laser light of the predetermined frequency is emitted to an illumination area via the light projection lens even if the fluorescent material is damaged. Safety is thus improved.

Furthermore, amount (A) detected by the detection element when the laser element is emitting the laser light and amount (B) detected by the detection element when the laser element is not emitting laser light are compared. When this comparison value (A–B) is larger than first threshold (H), the laser light from the laser element is stopped or attenuated. There is thus less influence of external light. Also in this regard, reliability with respect to safety is improved.

Accordingly, the illumination device and automobile equipped with same are expected to be effective.

The invention claimed is:
1. An illumination device comprising:
a laser element emitting laser light;
a fluorescent material disposed in a direction of propagation of the laser light from the laser element and converting the laser light into illumination light;
a light projection lens disposed in a direction of propagation of the illumination light from the fluorescent material;
a laser light reflector disposed in the direction of propagation of the illumination light from the fluorescent material;
a detection element that is configured to detect the laser light reflected on the laser light reflector and external light; and
a control unit connected to the detection element,
wherein
the control unit calculates a comparison value by comparing a first amount of laser light detected by the detection element when the laser element is emitting the laser light and a second amount of laser light detected by the detection element when the laser element is not emitting the laser light, and stops or attenuates the laser light from the laser element when the comparison value becomes larger than a first threshold.

2. The illumination device of claim 1, wherein
the laser element autonomously emits the laser light of a predetermined frequency, and the external light reaches the detection element via the light projection lens.

3. The illumination device of claim 1, wherein
the control unit stops or attenuates the laser light from the laser element when the comparison value becomes smaller than a second threshold different from the first threshold.

4. The illumination device of claim 1, wherein
the laser light reflector is disposed between the fluorescent material and the light projection lens.

5. The illumination device of claim 4, wherein
the laser light reflector is formed on a surface of the light projection lens facing the fluorescent material.

6. The illumination device of claim 1, wherein
the laser light reflector is disposed in the direction of propagation of the illumination light from the light projection lens.

7. The illumination device of claim 6, further comprising an outer lens disposed in the direction of propagation of the illumination light from the light projection lens, wherein
the laser light reflector is disposed on a surface of the outer lens facing the light projection lens.

8. An illumination device comprising:
a laser element emitting laser light;
a fluorescent material disposed in a direction of propagation of the laser light from the laser element, and converting the laser light into illumination light;
a light projection lens disposed in a direction of propagation of the illumination light from the fluorescent material;
a detection element that is configured to detect the laser light reflected on a surface of the fluorescent material facing the laser element and external light; and
a control unit connected to the detection element, wherein
the control unit calculates a comparison value by comparing a first amount of laser light detected by the detection element when the laser element is emitting the laser light and a second amount of laser light detected by the detection element when the laser element is not emitting the laser light, and stops or attenuates the laser light from the laser element when the comparison value becomes larger than a first threshold.

9. The illumination device of claim 8, wherein
the laser element autonomously emits the laser light of a predetermined frequency, and the external light reaches the detection element via the light projection lens.

10. The illumination device of claim 8, wherein
the control unit stops or attenuates the laser light from the laser element when the comparison value becomes smaller than a second threshold different from the first threshold.

11. An illumination device comprising:
a laser element emitting laser light;
a fluorescent material disposed in a direction of propagation of the laser light from the laser element, and converting the laser light into illumination light;
a light projection lens disposed in a direction of propagation of the illumination light from the fluorescent material;
a detection element that is configured to detect the laser light reflected on a surface of the light projection lens facing the fluorescent material and external light; and
a control unit connected to the detection element, wherein
the control unit calculates a comparison value by comparing a first amount of laser light detected by the detection element when the laser element is emitting the laser light and a second amount of laser light detected by the detection element when the laser element is not emitting the laser light, and stops or attenuates the laser light from the laser element when the comparison value becomes larger than a first threshold.

12. The illumination device of claim 11, wherein
the laser element autonomously emits the laser light of a predetermined frequency, and the external light reaches the detection element via the light projection lens.

13. The illumination device of claim 11, wherein
the control unit stops or attenuates the laser light from the laser element when the comparison value becomes smaller than a second threshold different from the first threshold.

14. An automobile comprising:
a main body; and
the illumination device of claim 1 disposed at the front of the main body.

* * * * *